United States Patent
Huang et al.

(10) Patent No.: US 11,272,620 B2
(45) Date of Patent: Mar. 8, 2022

(54) EMBEDDED CIRCUIT BOARD, MOBILE TERMINAL, AND METHOD FOR MANUFACTURING EMBEDDED CIRCUIT BOARD

(71) Applicant: SHENNAN CIRCUITS CO., LTD., Shenzhen (CN)

(72) Inventors: Lixiang Huang, Shenzhen (CN); Zedong Wang, Shenzhen (CN); Hua Miao, Shenzhen (CN)

(73) Assignee: SHENNAN CIRCUITS CO., LTD., Shenzhen (CN)

( * ) Notice: Subject to any disclaimer, the term of this patent is extended or adjusted under 35 U.S.C. 154(b) by 0 days.

(21) Appl. No.: 17/134,478

(22) Filed: Dec. 27, 2020

(65) Prior Publication Data
US 2022/0015237 A1 Jan. 13, 2022

Related U.S. Application Data

(63) Continuation of application No. PCT/CN2020/127021, filed on Nov. 6, 2020.

(30) Foreign Application Priority Data

Jul. 7, 2020 (CN) .......................... 202010645388.6

(51) Int. Cl.
*H05K 1/18* (2006.01)
*H05K 1/02* (2006.01)
(Continued)

(52) U.S. Cl.
CPC ........... *H05K 1/185* (2013.01); *H05K 1/0216* (2013.01); *H05K 1/09* (2013.01); *H05K 1/115* (2013.01); *H05K 3/107* (2013.01)

(58) Field of Classification Search
CPC ........ H05K 1/185; H05K 1/0216; H05K 1/09; H05K 1/115; H05K 3/107;
(Continued)

(56) References Cited

U.S. PATENT DOCUMENTS 10,568,209 B2 * 2/2020 Yosui .................... H05K 1/185
2008/0136013 A1 * 6/2008 Kamiya ................ H05K 1/186
29/830

(Continued)

FOREIGN PATENT DOCUMENTS

| CN | 101511148 A | 8/2009 |
| CN | 201797029 U | 4/2011 |

(Continued)

OTHER PUBLICATIONS

International search report,International Application No. PCT/CN2020/127021, dated Jun. 4, 2021 (16 pages).

*Primary Examiner* — Roshn K Varghese (57) ABSTRACT

The present disclosure relates to the technical field of circuit boards, and provides an embedded circuit board and a method for manufacturing the embedded circuit board. The embedded circuit board includes: a first outer wiring board, a base board, and a second outer wiring board. The base board has at least one groove, the first outer wiring board, the base board and the second outer wiring board define through holes to form a resonant chamber. A minimal distance between the side walls of the groove and the side walls of the adjacent through holes is 50 um-400 um. An electronic device is received in the groove.

20 Claims, 3 Drawing Sheets

(51) Int. Cl.
*H05K 1/11* (2006.01)
*H05K 3/10* (2006.01)
*H05K 1/09* (2006.01)

(58) Field of Classification Search
CPC . H05K 2201/10083; H01P 7/06; H01P 7/065; H01J 23/20; H01J 23/207
See application file for complete search history.

(56) References Cited

U.S. PATENT DOCUMENTS

2012/0186866 A1* 7/2012 Mikado ............... H05K 3/4602
174/260
2016/0330840 A1* 11/2016 Leitgeb .................... H01G 5/38
2020/0112075 A1 4/2020 Myers et al.

FOREIGN PATENT DOCUMENTS

| CN | 102254885 A | 11/2011 |
| CN | 203150678 U | 8/2013 |
| CN | 106848519 A | 6/2017 |
| JP | 2013211426 A | 10/2013 |

* cited by examiner

EMBEDDED CIRCUIT BOARD, MOBILE TERMINAL, AND METHOD FOR MANUFACTURING EMBEDDED CIRCUIT BOARD

CROSS-REFERENCE TO RELATED APPLICATIONS

The present application is a continuation-application of International (PCT) Patent Application No. PCT/CN2020/127021 filed on Nov. 6, 2020, which claims a foreign priority of Chinese Patent Application No. 202010645388.6, filed on Jul. 7, 2020 in the National Intellectual Property Administration of China, the entire contents of which are hereby incorporated by reference in their entireties.

TECHNICAL FIELD

The present disclosure relates to the field of circuit boards, and in particular to an embedded circuit board, a mobile terminal, and a method for manufacturing an embedded circuit board.

BACKGROUND

As electronic products are developed to be miniaturization, having high density and various functions, the number of components and the number of interconnections in the electronic products have gradually increased, and the physical sizes of the components and the interconnections have become increasingly smaller. Therefore, the system-in-package technology, which integrates electronic systems composed of various active and passive components into a common package, has become a significant trend in the future.

Many printed circuit boards have resonant circuits, and the resonant circuits are configured to form a bandpass filter. The resonant circuit is generally formed by connecting a capacitor and an inductor in parallel. In a high-density printed circuit board, the number of inductors and the number of capacitors are huge. How to integrate the huge numbers of the inductors and capacitors is an important factor affecting miniaturization of the product.

SUMMARY OF THE DISCLOSURE

According to a first aspect of the present disclosure, an embedded circuit board is provided and includes: a first outer wiring board, a base board, a second outer wiring board, and an electronic element. The first outer wiring board, the base board, and the second outer wiring board are stacked sequentially. The base board defines at least one groove between the first outer wiring board and the second outer wiring board. A through hole is defined in each of the first outer wiring board, the base board, and the second outer wiring board. The through hole in the first outer wiring board, the through hole in the base board, and the through hole in the second outer wiring board are communicated with each other to serve as a resonant chamber. A minimal distance between a side wall of the at least one groove and a side wall of the through hole adjacent to the at least one groove is in a range of 50 um to 400 um. The electronic element is received in the groove.

According to a second aspect of the present disclosure, a mobile terminal is provided and includes an embedded circuit board. The embedded circuit board includes: a first outer wiring board, a base board, a second outer wiring board, and an electronic element. The first outer wiring board, the base board, and the second outer wiring board are stacked sequentially. The base board defines at least one groove between the first outer wiring board and the second outer wiring board. A resonant chamber is defined in the embedded circuit board and extending through the first outer wiring board, the base board, and the second outer wiring board. The electronic element is received in the groove. The resonant chamber includes two adjacent resonant chambers and defined by a chamber wall in common. The chamber wall defines a coupling window, and signals between the two adjacent resonant chambers are coupled through the coupling window. A resonant oscillator is received in each of the two resonant chambers, a coupling block is received in the coupling window of the chamber wall. An end face is arranged at each of two end portions of the coupling block, and the end face is parallel to a surface of the resonant oscillator. An electromagnetic field is generated at an outer periphery of the end face of the coupling block, and a direction of the electromagnetic field is the same as a direction of the surface of the resonant oscillator According to a third aspect of the present disclosure, a method for manufacturing an embedded circuit board is provided and includes: providing a base board having at least one groove, wherein an electronic element is received in the at least one groove; disposing a first outer wiring board and a second outer wiring board on two opposite sides of the base board; compressing the first outer wiring board, the second outer wiring board, and the base board to fix the first outer wiring board, the second outer wiring board, and the base board; defining a hole in the first outer wiring board, the second outer wiring board, and the base board to obtain at least one through hole in the first outer wiring board, the second outer wiring board, and the base board. The at least one through hole serves as a resonant chamber, and a minimal distance between a side wall of the at least one groove and a side wall of the through hole adjacent to the at least one groove is in a range of 100 um to 500 um.

BRIEF DESCRIPTION OF THE DRAWINGS

In order to illustrate technical solutions of embodiments of the present disclosure clearly, accompanying drawings for describing the embodiments will be introduced in brief. Obviously, the drawings in the following description are only some embodiments of the present application. For those skilled in the art, other drawings can be acquired based on the provided drawings without any creative work.

DETAILED DESCRIPTION

Technical solutions of the embodiments of the present disclosure may be clearly and comprehensively described by referring to accompanying figures of the embodiments. Obviously, embodiments to be described are only a part of, but not all of, the embodiments of the present disclosure. Any ordinary skilled person in the art may obtain other embodiments based on the embodiments of the present disclosure without any creative work, and the other embodiments should be included in the scope of the present disclosure.

Figure 1:
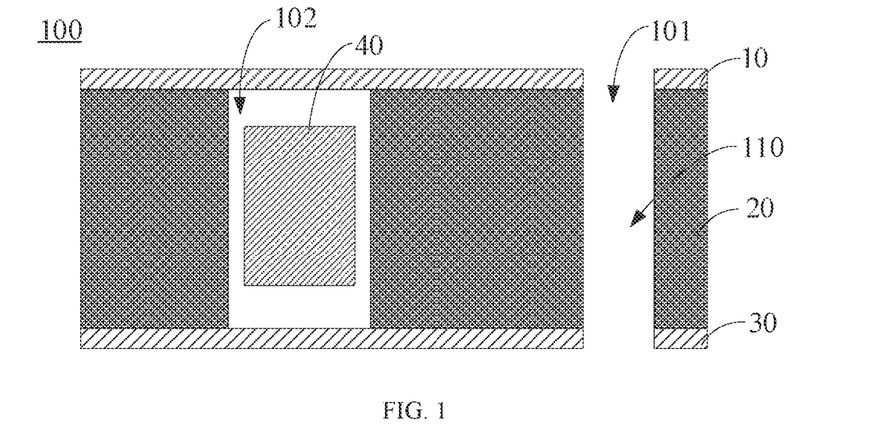
FIG. 1 is a structural schematic view of an embedded circuit board according to a first embodiment of the present disclosure.

As shown in FIG. 1, the present disclosure provides an embedded circuit board 100. The embedded circuit board 100 may include: a first outer wiring board 10, a base board 20, and a second outer wiring board 30, which are stacked sequentially.

The first outer wiring board 10 may be disposed on an upper surface of the base board 20. The first outer wiring board 10 may be a copper layer on the upper surface of the base board 20. The second outer wiring board 30 may be disposed on a lower surface of the base board 20. The second outer wiring board 30 may be a copper layer on the lower surface of the base board 20.

The base board 20 may define at least one though hole 101 and at least one groove 102. The groove 102 may be defined by depth-control milling. The depth-control milling may refer to a technology of using a milling machine for controlling a depth along a Z direction, and the technology may be limited by accuracy of depth-control milling along the Z direction of the milling machine. A length and a width of the groove 102 may be greater than a length and a width of an embedded chip, such that a space of the groove 102 may be enough to receive the embedded chip. The groove 102 may be in a shape of a regular cube, may be trapezoid, or may be step-shaped. The shape of the groove 102 may be determined based on actual needs of a practical work, and will not be limited by the present disclosure. In order to provide intuitive description, the groove 102 is shown as cuboid in the present disclosure.

The at least one through hole 101 may further be defined in each of the first outer wiring board 10 and the second outer wiring board 30. The through hole 101 in the first outer wiring board 10, the through hole 101 in the base board 20, and the through hole 101 in the second outer wiring board 30 may communicate with each other to serve as a resonant chamber 110. In the present embodiment, the resonant chamber 110 may be squared. In other embodiments, the resonant chamber 110 may be L-shaped, circular, U-shaped, or S-shaped.

Further, the embedded circuit board 100 may further include an electronic element 40. The electronic element 40 may be received in the groove 102 of the base board 20. The number of grooves 102 may be equal to the number of electronic elements 40. In this situation, one electronic element 40 may be received in one groove 102. The number of grooves 102 may be different from the number of electronic elements 40. In detail, the number of grooves 102 may be less than the number of electronic elements 40. In this situation, two or more electronic elements 40 may be received in one groove 102. The electronic element 40 may be a device working by physical vibration, such as at least one of, but not limited to: a mini-microphone, a mini-loudspeaker, an acoustic wave resonator, a microwave resonator, an ultrasonic transducer, a sensor chip, a digital chip. The electronic element 40 may be a tuning element. The tuning element may adjust a resonance frequency of a resonator corresponding to the resonant chamber 110. The tuning element may be a capacitor and/or an inductor.

Further, a minimal distance between a side wall of the groove 102 and a side wall of the through hole 101 adjacent to the groove 102 may be 50 µm to 500 µm, such as 100 µm, 200 µm, 400 µm, or 500 µm. Preferably, the minimal distance between the side wall of the groove 102 and the side wall of the through hole 101 may be 200 µm to 450 µm, such as, 200 µm, 300 µm, 400 µm, or 450 µm.

An inner circumferential wall of the resonant chamber 110 may be an insulated inner circumferential wall. A function of the resonant chamber 110 may be different from that of a metallized through hole. The resonant chamber 110 may not be electrically conductive, but may conduct and amplify information such as sound wave vibration, an atmospheric pressure, temperature, and humidity, such that the information may be sensed by the electronic element 40 (such as a sensor chip) received in the groove 102. In this way, the information may be converted into an electric signal and displayed in a product, such as a mobile device, a sensor assembly, and so on.

Figure 2:
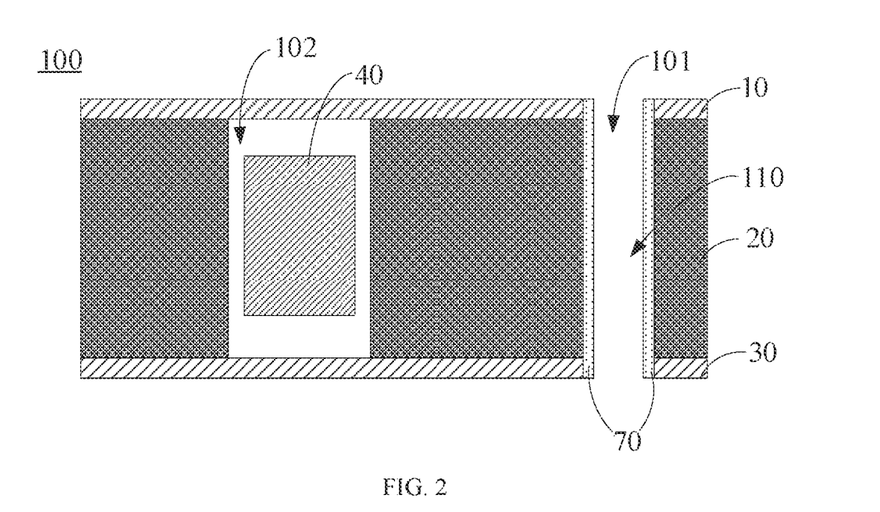
FIG. 2 is a structural schematic view of an embedded circuit board according to a second embodiment of the present disclosure.

In another embodiment, as shown in FIG. 2, a copper layer 70 may be disposed on the inner circumferential wall of the resonant chamber 110 to serve as an electrical connection layer.

According to the present embodiment, each of the first outer wiring board 10, the base board 20, and the second outer wiring board 30 may define the through hole 101, and the through holes 101 may communicate with each other to serve as the resonant chamber 110. The electronic element 40 may be received in the groove 102 of the base board 20. In this way, the number of elements disposed on a surface of the entire circuit board 100 may be reduced, and miniaturization of the circuit board may be achieved. At the same time, the minimal distance between the side wall of the groove 102 and the side wall of the through hole 101 adjacent to the groove 102 may be 50 µm to 500 µm, such that the resonant wave may be prevented from transmitting to the electronic element 40 directly, the electronic element 40 may be protected from being loose and falling off, and the electronic element 40 received in the groove 102 may be protected from being harmed while defining the through hole 101. At the same time, a plurality of electronic elements may be received into one same resonant chamber. The circuit board may be highly waterproof and may have a relatively low manufacturing cost.

Figure 3:
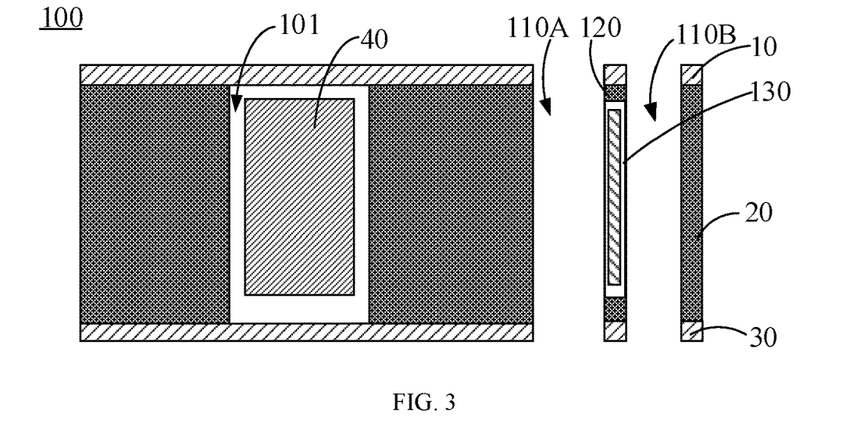
FIG. 3 is a structural schematic view of an embedded circuit board according to a third embodiment of the present disclosure.

As shown in FIG. 3, two adjacent resonant chambers 110A and 110B may be defined by a chamber wall 120 in common. The chamber wall 120 may define a coupling window 130. The coupling window 130 may be defined to allow signals of the two adjacent resonant chamber 110A and 110B to be coupled. The coupling window 130 may be a general inductive coupling structure, or a capacitive coupling structure having a protrusion on a top of the window and a protrusion on a bottom of the window.

In the present embodiment, two adjacent resonant chambers 110A and 110B may be shown for illustration. The two resonant chambers 110A and 110B may be spaced apart from each other by the chamber wall 120. Further, the coupling window 130 of the chamber wall 120 may extend from a top of the chamber wall 120 to a bottom of the chamber wall 120. In this way, a coupling strength may be maximized.

Further, a resonant oscillator (not shown in the figures) may be received in each of the two resonant chambers 110A and 110B, and a coupling block (not shown in the figures) in a certain shape may be received in the coupling window 130 of the chamber wall 120. An end face may be arranged at each of two end portions of the coupling block respectively, and the end face may be parallel to a surface of the resonant oscillator. In this way, an electromagnetic field may be generated at a periphery of the end face of the coupling block, and a direction of the electromagnetic field may be the same as a direction of the surface of the resonant oscillator. When the resonant oscillator and the coupling block are close enough, the coupling block may generate sufficient perturbation to the electromagnetic field at an outer side of the surface of the resonant oscillator, such that a coupling effect between the two adjacent resonant chambers 110A and 110B may be improved.

Figure 4:
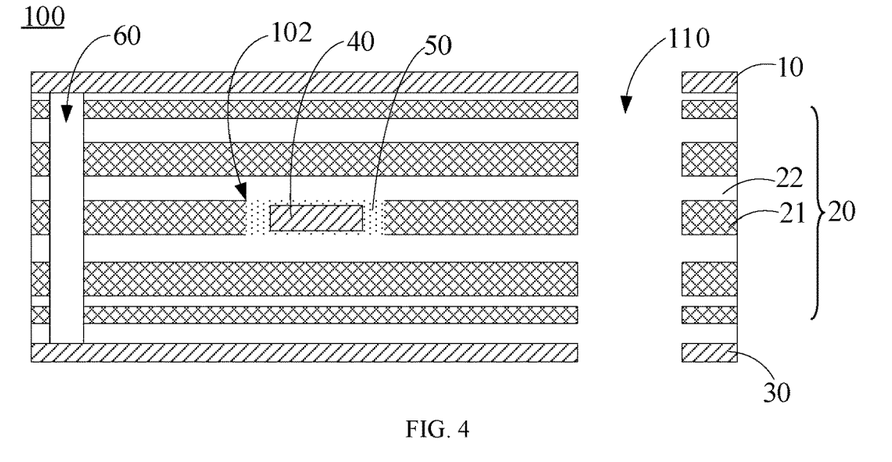
FIG. 4 is a structural schematic view of an embedded circuit board according to a fourth embodiment of the present disclosure.

As shown in FIG. 4, the base board 20 may include a plurality of meltable dielectric layers 22 and a plurality of sub-boards 21. The plurality of meltable dielectric layers 22 and the plurality of sub-boards 21 may be stacked alternately. At least one of the plurality of sub-boards 21 may define the groove 102. After the plurality of sub-boards 21 and the plurality of meltable dielectric layers 22 are compressed, at least a portion of the plurality of meltable dielectric layers 22 may flow to a space between the electronic element 40 and the side wall of the groove 102.

In detail, each of the plurality of sub-boards 22 may be a non-copper core board or a copper clad laminate. Configuring each of the plurality of sub-boards 22 to be the non-copper core board is to increase a thickness of the embedded circuit board 100, such that the thickness of the embedded circuit board may be adapted to allow the electronic element 40 to be embedded therein. Each of the plurality of sub-boards 22 may be the copper clad laminate, and wires may be configured on the copper clad laminate for electrical connection.

Each of the plurality of meltable dielectric layers 22 may be disposed between two adjacent ones of the plurality of sub-boards 21. While compressing, at least a portion of the plurality of meltable dielectric layers 22 may flow into the space between the electronic element 40 and the side wall of the groove 102, and may contact the electronic element 40. In this way, the plurality of sub-boards 21 and the electronic element 40 may be bonded together.

Material of the plurality of meltable dielectric layers 22 may be at least one or a combination of resin and silicone resin glue. In detail, the resin may refer to an organic polymer, which has a softening or melting range after being heated, and tends to flow under an external force during softening. The resin may be solid, semi-solid, and sometimes, liquid at a room temperature. The resin may be an adhesive, such as epoxy resin, silicone resin, polyimide resin, phenolic resin, polyurethane, acrylic resin and so on. The silicone resin glue is a colorless and transparent liquid. The silicone resin glue has certain air permeability and elasticity after curing. The silicone resin glue may have temperature resistance, weather resistance, electrical insulation, physiological inertia, low surface tension and a low surface energy.

Figure 5:
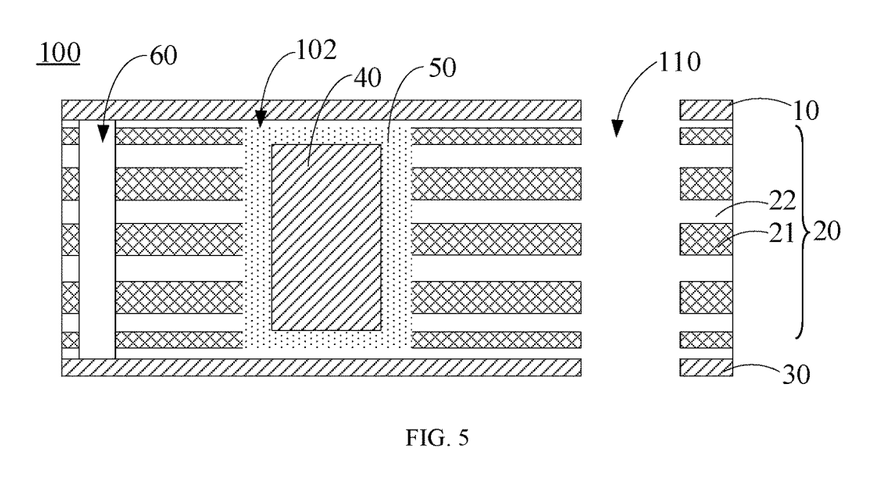
FIG. 5 is a structural schematic view of an embedded circuit board according to a fifth embodiment of the present disclosure.

Further, as shown in FIG. 5, the groove 102 may be defined in each of the plurality of sub-boards 21 and each of the plurality of meltable dielectric layers 22 disposed between adjacent sub-boards 22. That is, the groove 102 may be defined to extend through each of the plurality of sub-boards 21 and each of the plurality of meltable dielectric layers 22 disposed between adjacent sub-boards 22.

Further, as shown in FIG. 3 and FIG. 4, a package 50 may be coated on an outer surface of the electronic element 40. After the plurality of sub-boards 21 and the plurality of meltable dielectric layers 22 are compressed, at least a portion of the plurality of meltable dielectric layers 22 may flow to a space between the package 50 and the side wall of the groove 102, and may contact the package 50.

Material of the package 50 may be the silicone resin glue. The silicone resin glue may be the colorless and transparent liquid, and may have certain air permeability and elasticity after curing. The silicone resin glue may have temperature resistance, weather resistance, electrical insulation, physiological inertia, low surface tension and the low surface energy.

According to the above embodiment, the package 50 made of the silicone resin glue may be coated on the outer surface of the electronic element 40. The silicone resin glue may have better performance on transferring heat, conducting heat and dissipating heat. Therefore, the package 50 may be resistant to a high temperature have an excellent heat dissipation capability. While the electronic element 40 is working, a temperature of the electronic element 40 may be increased, and the package 50 may dissipate the heat rapidly. At the same time, the package 50 made of the silicone resin glue may stably bond with the side walls of the electronic device 40 and the groove 102. Therefore, the problem of the electronic element 40 falling off and expanding may be solved effectively.

Further, a metal sheet (not shown in the figure) may be disposed inside the package 50. The metal sheet may be configured in the silicone resin glue of the package, an end of the metal sheet may be electrically connected to the electronic element 40, and the other end of the metal sheet may protrude out of the package 50 and may be electrically connected to a ground line layer, a signal line layer, or a conductive element 60. The metal sheet may be made of metal only. Material of the metal sheet may include, but is not limited to, copper, copper alloy, aluminum, aluminum alloy, iron, iron alloy, nickel, nickel alloy, gold, gold alloy, silver, silver alloy, platinum group, platinum group alloy, chromium, chromium alloy, magnesium, magnesium alloy, tungsten, tungsten alloy, Molybdenum, molybdenum alloy, lead, lead alloy, tin, tin alloy, indium, indium alloy, zinc, zinc alloy, and so on. In another embodiment, the metal sheet may be made of a metal base block and a conductive graphite sheet. Since thermal resistance of the conductive graphite sheet is lower than that of an ordinary metal and alloy, the conductive graphite sheet can be embedded in the metal base block to make heat conduction faster.

As shown in FIG. 4, the conductive element 60 may be configured in the base board 20 to allow a plurality of layers to be connected. A connection end of the electronic element 40 may be electrically connected to the first outer wiring board and/or the second outer wiring board through the conductive via 60.

In detail, a hole may be defined in the base board 20. In the present embodiment, the hole may extend through each of the plurality of sub-boards 21 and each of the plurality of meltable dielectric layers 22. A signal layer electrically connected to the sub-boards 21 and/or a conductive layer connected to the ground layer may be received in the hole. In this way, the conductive element 60 may be obtained. In the present embodiment, the hole may be metallized by electroplating. In detail, in a salt solution containing the metal to be electroplated, the metal of a wall of the hole may be used as a cathode, and cations of the metal to be electroplated in the electroplating solution may be deposited on the metal of the wall of the hole through electrolysis. In this way, a conductive layer may be formed. Metals commonly used for electroplating may include, but are not limited to, titanium, palladium, zinc, cadmium, gold, and brass. Of course, in other embodiments, the metallization of the hole may also be achieved by coating.

Alternatively, one or more components (not shown in the figures) may be configured on a side of the first outer wiring board or a side of the second outer wiring board away from the base board 20. Alternatively, a plurality of components may be configured on the side of the first outer wiring board away from the base board 20, and a plurality of components may be configured on the side of the second outer wiring board away from the base board 20. The plurality of components may be electrically connected to the electronic element 40 via the first outer wiring board and/or the second outer wiring board. The components may be one or more of: a microphone chip, a capacitor chip, a resistor chip, a power source component.

According to the present disclosure, electronic elements, such as a digital chip and the like, may be embedded in the base board, whereas components, such as the microphone chip and the like, may still be disposed to the surface of the circuit board and above the through hole 101. In this way, the overall thickness and size of the embedded circuit board 100 may be reduced. At the same time, as the electronic elements, such as the digital chip and the like, are disposed inside the base board and completely covered by the base board, the resonant chamber may not affect the digital chip. A better shielding effect may be achieved, external interference, such as noise, received by the electronic elements may be reduced, and performance of the electronic elements may be improved.

The embedded circuit board 100 according to the embodiment of the present disclosure may be applied in a mobile device or a sensor assembly.

Figure 6:
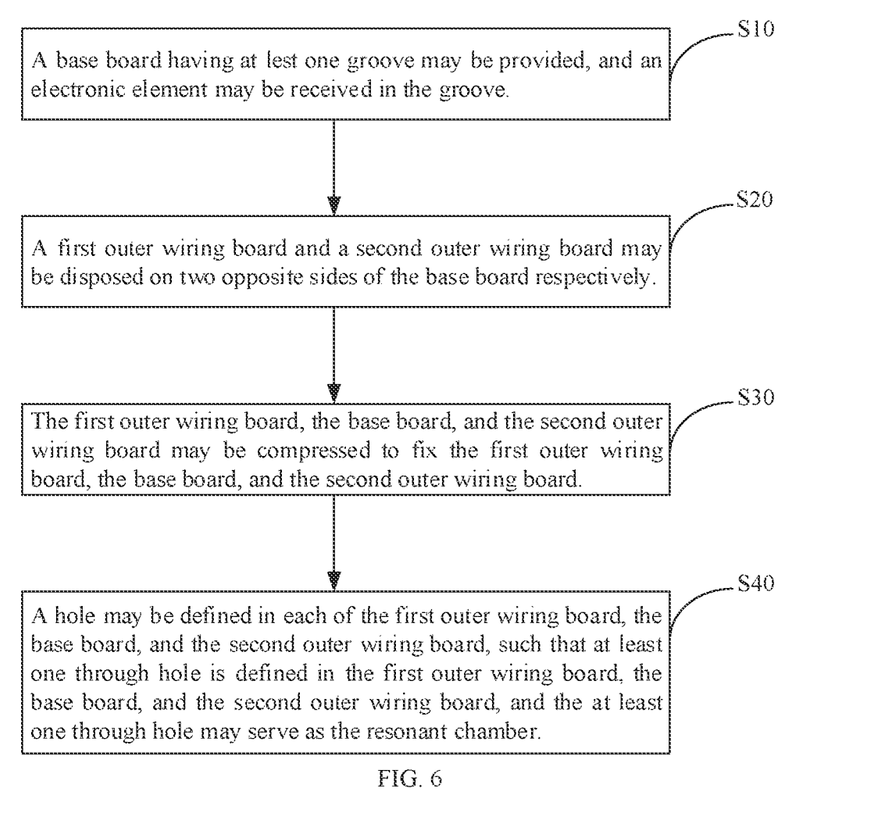
FIG. 6 is a flow chart of a method for manufacturing the embedded circuit board according to an embodiment of the present disclosure.

As shown in FIG. 6, a method for manufacturing the embedded circuit board is provided includes following operations.

In an operation S10, a base board having at least one groove may be provided, and an electronic element may be received in the groove.

In other embodiments, the groove and at least one through hole may be defined in the base board firstly, and the electronic element may be received in the groove correspondingly.

In an operation S20, a first outer wiring board and a second outer wiring board may be disposed on two opposite sides of the base board respectively.

In an operation S30, the first outer wiring board, the base board, and the second outer wiring board may be compressed to be fixed.

In an operation S40, a through hole may be defined in each of the first outer wiring board, the base board, and the second outer wiring board, such that the hole may extend through the first outer wiring board, the base board, and the second outer wiring board to serve as the resonant chamber.

In other embodiments, the through hole may be defined in the first outer wiring board, the base board, and the second outer wiring board first, and subsequently, the first outer wiring board, the base board, and the second outer wiring board may be stacked and compressed.

A minimal distance between a side wall of the groove and a side wall of the through hole adjacent to the groove may be 50 µm to 500 µm.

According to the present embodiment, the through hole may be defined in the first outer wiring board, the base board, and the second outer wiring board to serve as the resonant chamber, and the electronic elements may be received in the groove of the base board. In this way, the number of elements disposed on the surface of the entire circuit board may be reduced, and miniaturization of the circuit may be achieved. At the same time, the minimal distance between the side wall of the groove and the side wall of adjacent communicating through holes may be 50 µm to 500 µm. The resonant wave may not be transmitted to the electronic element directly, such that the electronic element may be protected from being loose and falling off, and the electronic element may be protected from being harmed while defining the through hole. Further, a plurality of electronic elements may be embedded into the circuit board, and the plurality of electronic elements may be received in a resonant chamber in common. The circuit board may be highly waterproof and may have a relatively low manufacturing cost.

The present disclosure further provides a mobile terminal including the embedded circuit board 100 as mentioned in the above embodiments.

The present disclosure further provides a sensor assembly including the embedded circuit board 100 as mentioned in the above embodiments.

The above only describes implementations of the present disclosure, and does not limit the scope of the present disclosure. Any equivalent structural or equivalent process transformation performed based on the content of the present description and drawings, directly or indirectly applied to other related art, should also be included in the scope of the present disclosure.

What is claimed is:

1. An embedded circuit board, comprising:
a first outer wiring board, a base board, and a second outer wiring board, stacking sequentially, wherein
the base board defines at least one groove between the first outer wiring board and the second outer wiring board;
a through hole is defined in each of the first outer wiring board, the base board, and the second outer wiring board, the through hole in the first outer wiring board, the through hole in the base board, and the through hole in the second outer wiring board are communicated with each other to serve as a resonant chamber; and
a minimal distance between a side wall of the at least one groove and a side wall of the through hole adjacent to the at least one groove is in a range of 50 um to 500 um; and
an electronic element, received in the groove,
wherein the resonant chamber is configured to conduct and amplify information to the electronic element, and the electronic element is configured to sense the information and convert the information into an electric signal.

2. The embedded circuit board according to claim 1, wherein the minimal distance between the side wall of the at least one groove and the side wall of the through hole adjacent to the at least one groove is in a range of 200 um to 450 um.

3. The embedded circuit board according to claim 1, wherein a copper layer is disposed on an inner circumferential wall of the resonant chamber.

4. The embedded circuit board according to claim 1, wherein
the resonant chamber comprises two adjacent resonant chambers defined by a chamber wall in common;
the chamber wall defines a coupling window, and the signals between the two adjacent resonant chambers are coupled through the coupling window.

5. The embedded circuit board according to claim 4, wherein a resonant oscillator is received in each of the two adjacent resonant chambers, a coupling block is received in the coupling window of the chamber wall;

an end face is arranged at each of two end portions of the coupling block, and the end face is parallel to a surface of the resonant oscillator; and an electromagnetic field is generated at an outer periphery of the end face of the coupling block, and a direction of the electromagnetic field is the same as a direction of the surface of the resonant oscillator.

6. The embedded circuit board according to claim 1, wherein the base board comprises a plurality of meltable dielectric layers and a plurality of sub-boards, the plurality of meltable dielectric layers and the plurality of sub-boards are stacked alternately;

the groove is defined in at least one of the plurality of sub-boards;

the plurality of meltable dielectric layers and the plurality of sub-boards are compressed, and at least a portion of the plurality of meltable dielectric layers flow to a space between the electronic element and the side wall of the at least one groove.

7. The embedded circuit board according to claim 6, wherein the at least one groove is defined in each of the plurality of sub-boards and each of the plurality of meltable dielectric layers.

8. The embedded circuit board according to claim 7, further comprising a package, disposed on an outer surface of the electronic element, wherein the plurality of meltable dielectric layers and the plurality of sub-boards are compressed, and at least a portion of the plurality of meltable dielectric layers flows to a space between the package and the side wall of the at least one groove and contacts the package.

9. The embedded circuit board according to claim 6, further comprising a package, disposed on an outer surface of the electronic element, wherein the plurality of meltable dielectric layers and the plurality of sub-boards are compressed, and at least a portion of the plurality of meltable dielectric layers flows to a space between the package and the side wall of the at least one groove and contacts the package.

10. The embedded circuit board according to claim 6, wherein the plurality of sub-boards are non-copper core boards.

11. The embedded circuit board according to claim 1, wherein the electronic element is at least one of a mini-microphone, a mini-loudspeaker, a capacitor, an inductor, an acoustic wave resonator, a microwave resonator, an ultrasonic transducer, and a digital chip.

12. The embedded circuit board according to claim 1, wherein the base board is configured with a conductive element for connecting layers, and a connection end of the electronic element is electrically connected to the first outer wiring board and/or the second outer wiring board through the conductive board.

13. The embedded circuit board according to claim 11, wherein at least one component is disposed on a side of the first outer wiring board and/or a side of the second outer wiring board away from the base board;

the at least one component is electrically connected to the electronic element through the first outer wiring board and/or the second outer wiring board; and the at least one component is at least one of a microphone chip, a capacitor component, a resistor component, and a power source component.

14. The embedded circuit board according to claim 1, wherein the embedded circuit board is configured in a mobile terminal or a sensor assembly.

15. A mobile terminal, comprising an embedded circuit board, wherein the embedded circuit board comprises:

a first outer wiring board, a base board, and a second outer wiring board, stacking sequentially, wherein the base board defines at least one groove between the first outer wiring board and the second outer wiring board;

a resonant chamber is defined in the embedded circuit board and extending through the first outer wiring board, the base board, and the second outer wiring board; and an electronic element, received in the groove;

wherein the resonant chamber comprises two adjacent resonant chambers and defined by a chamber wall in common;

the chamber wall defines a coupling window, and signals between the two adjacent resonant chambers are coupled through the coupling window;

a resonant oscillator is received in each of the two resonant chambers, a coupling block is received in the coupling window of the chamber wall;

an end face is arranged at each of two end portions of the coupling block, and the end face is parallel to a surface of the resonant oscillator; and an electromagnetic field is generated at an outer periphery of the end face of the coupling block, and a direction of the electromagnetic field is the same as a direction of the surface of the resonant oscillator, wherein the resonant chamber is configured to conduct and amplify information to the electronic element, and the electronic element is configured to sense the information and convert the information into an electric signal.

16. The mobile terminal according to claim 15, wherein a minimal distance between a side wall of the at least one groove and a side wall of the resonant chamber adjacent to the at least one groove is in a range of 50 um to 500 um.

17. The mobile terminal according to claim 15, wherein a copper layer is disposed on an inner circumferential wall of the resonant chamber.

18. The mobile terminal according to claim 15, wherein the base board comprises a plurality of meltable dielectric layers and a plurality of sub-boards, the plurality of meltable dielectric layers and the plurality of sub-boards are stacked alternately;

the groove is defined in at least one of the plurality of sub-boards;

the plurality of meltable dielectric layers and the plurality of sub-boards are compressed, and at least a portion of the plurality of meltable dielectric layers flow to a space between the electronic element and the side wall of the at least one groove.

19. The mobile terminal according to claim 18, wherein the embedded circuit board further comprises a package, disposed on an outer surface of the electronic element; and the plurality of meltable dielectric layers and the plurality of sub-boards are compressed, and at least a portion of the plurality of meltable dielectric layers flows to a space between the package and the side wall of the at least one groove and contacts the package.

20. A method for manufacturing an embedded circuit board, comprising:
- providing a base board having at least one groove, wherein an electronic element is received in the at least one groove;
- disposing a first outer wiring board and a second outer wiring board on two opposite sides of the base board;
- compressing the first outer wiring board, the second outer wiring board, and the base board to fix the first outer wiring board, the second outer wiring board, and the base board;
- defining a hole in the first outer wiring board, the second outer wiring board, and the base board to obtain at least one through hole in the first outer wiring board, the second outer wiring board, and the base board,
- wherein the at least one through hole serves as a resonant chamber, and a minimal distance between a side wall of the at least one groove and a side wall of the through hole adjacent to the at least one groove is in a range of 100 um to 500 um, and
- wherein the resonant chamber is configured to conduct and amplify information to the electronic element, and the electronic element is configured to sense the information and convert the information into an electric signal.

* * * * *